(12) United States Patent
Takase et al.

(10) Patent No.: US 7,162,131 B2
(45) Date of Patent: Jan. 9, 2007

(54) RADIATION-CURABLE COMPOSITION, OPTICAL WAVEGUIDE AND METHOD FOR FORMATION THEREOF

(75) Inventors: Hideaki Takase, Tokyo (JP); Kentarou Tamaki, Tokyo (JP); Jun Huangfu, Tokyo (JP); Tomohiro Utaka, Tokyo (JP); Yuuichi Eriyama, Tokyo (JP)

(73) Assignee: JSR Corporation, Tokyo (JP)

( * ) Notice: Subject to any disclaimer, the term of this patent is extended or adjusted under 35 U.S.C. 154(b) by 16 days.

(21) Appl. No.: 10/513,355

(22) PCT Filed: Oct. 20, 2003

(86) PCT No.: PCT/JP03/13371

§ 371 (c)(1),
(2), (4) Date: Jul. 5, 2005

(87) PCT Pub. No.: WO2004/083309

PCT Pub. Date: Sep. 30, 2004

(65) Prior Publication Data

US 2006/0165362 A1    Jul. 27, 2006

(30) Foreign Application Priority Data

Mar. 18, 2003 (JP) .............................. 2003-117642

(51) Int. Cl.
*G02B 6/10* (2006.01)
*G03C 1/73* (2006.01)

(52) U.S. Cl. .................................. 385/129; 430/270.1
(58) Field of Classification Search ..................... None See application file for complete search history.

(56) References Cited

U.S. PATENT DOCUMENTS 6,207,728 B1 * 3/2001 Sekiguchi et al. ............. 522/83
7,005,231 B1 * 2/2006 Tamaki et al. ........... 430/270.1

FOREIGN PATENT DOCUMENTS

| JP | 04-157402 | | 5/1992 |
| JP | 06-109936 | | 4/1994 |
| JP | 9-325201 | | 12/1997 |
| JP | 10-246960 | | 9/1998 |
| JP | 2000-1648 | | 1/2000 |
| JP | 2000-1648 A | * | 1/2000 |
| JP | 2000-66051 | | 3/2000 |
| JP | 2000-180643 | | 6/2000 |
| JP | 2000-230052 | | 8/2000 |

(Continued)

*Primary Examiner*—Sung Pak
*Assistant Examiner*—Tina M. Wong
(74) *Attorney, Agent, or Firm*—Oblon, Spivak, McClelland, Maier & Neustadt, P.C.

(57) ABSTRACT

A radiation-curable composition containing (A) hydrolyzates of hydrolyzable silane compounds represented by general formula (1): $(R^1)_p(R^2)_q Si(X)_{4-p-q}$ (wherein $R^1$ is a non-hydrolyzable organic group having 1 to 12 carbon atoms that contains fluorine atoms, $R^2$ is a non-hydrolyzable organic group having 1 to 12 carbon atoms (but excluding ones that contain fluorine atoms), X is a hydrolyzable group, p is an integer of 1 or 2, and q is an integer of 0 or 1) and condensates of such hydrolyzates, and (B) a photo acid generator, wherein the ratio of silanol (Si—OH) groups in the composition is 0.1 to 0.5 out of all the bonding groups on Si. With such a composition, the waveguide loss is low for light having a wavelength in a broad range from the visible region to the near infrared region, and moreover the cracking resistance, the patterning ability upon irradiation with radiation, and so on are excellent.

18 Claims, 2 Drawing Sheets

FOREIGN PATENT DOCUMENTS

| | | | | | |
|---|---|---|---|---|---|
| JP | 2002-107932 | 4/2002 | JP | 2003-185860 | 7/2003 |

* cited by examiner

RADIATION-CURABLE COMPOSITION, OPTICAL WAVEGUIDE AND METHOD FOR FORMATION THEREOF

TECHNICAL FIELD

The present invention relates to a radiation-curable composition for producing optical circuits used in the optical communications field, the optical data processing field and so on, an optical waveguide using this composition, and a method of forming the optical waveguide.

BACKGROUND ART

As we enter the multimedia age, there are demands to increase the capacity and speed of data processing in optical communication systems and computers, and transmission systems that use light as a transmission medium have come to be used in LANs (local area networks), FA (factory automation), interconnection between computers, household wiring and so on.

Optical waveguides used in such transmission systems are fundamental constituent elements in, for example, optical devices, optoelectronic integrated circuits (OEICs) and optical integrated circuits (optical ICs) for realizing high-capacity data transmission of movies, moving pictures and so on, and for realizing optical computers and so on. Due to mass demand, assiduous research is being carried out into optical waveguides, and in particular, high-performance and low-cost products are demanded.

Until now, quartz optical waveguides and polymer optical waveguides have been known. Of these, quartz optical waveguides have better transmission properties than polymer optical waveguides, but a vitrifaction process (at above 1200° C.) carried out after depositing oxide fine particles, and etching treatment are required, and hence strict manufacturing conditions over a long time are required in the manufacture. On the other hand, with regard to polymer optical waveguides, a thin film can easily be formed using a spin coating method, a dip coating method or the like, and moreover manufacture can be carried out through a low-temperature process using reactive ion etching (RIE) or photolithography. In particular, optical waveguides formed by using photolithography can be manufactured in a short time, and hence have the advantage of being able to be formed more easily and at lower cost than quartz optical waveguides.

As materials used for polymer optical waveguides, polysiloxanes having high thermal resistance have been proposed, and by introducing phenyl groups, methyl groups, ethyl groups or the like into the polymer, control of the refractive index and improvement of cracking resistance have been accomplished. Moreover, art, in which a polysiloxane material known as being heat-curable is made to be radiation-curable by introducing radiosensitive groups therein, has also be reported (see Japanese Patent Application Laid-open No. 2000-66051 and Japanese Patent Application Laid-open No. 6-109936). However, the C—H bonds contained in alkyl groups such as methyl groups exhibit the second harmonic arises in the 1.55 μm wavelength band, causing an increase in the loss in this band. To avoid this, polysiloxanes, in which alkyl groups are not used but all are substituted with phenyl groups, have been reported, but the hardness of a thin film increases, and there is a tendency for a thin film to cause cracks during manufacture. It has been hard to attain both loss reduction and cracking prevention.

On the other hand, an approach, in which C—H bonds contained in the polysiloxane are substituted with C-D bonds or C—F bonds, has been reported, but because this polysiloxane is of a heat-curable type, self core formation using a method such as photolithography cannot be carried out, and hence core formation using a method such as etching has been required (see Japanese Patent Application Laid-open No. 4-157402 and Japanese Patent Application Laid-open No. 2000-230052).

Furthermore, in the art of substituting C—H bonds with C-D bonds or C—F bonds, there have been problems such as the third harmonic of the C-D bonds again arising in the 1.55 μm wavelength band resulting in difficulty in reducing the loss, or peeling away occurring at the core portion/clad layer or clad layer/substrate interface upon the introduction of C—F groups.

DISCLOSURE OF THE INVENTION

As described above, the manufacture of conventional polymer optical waveguides is relatively easy compared with that of quartz optical waveguides, but there have been demands to fulfill both low transmission loss and good cracking resistance, and make the polymer optical waveguide have all of various properties such as prolonged stable use with no occurrence of cracking or peeling.

In the present invention, based on such a state of affairs, it is aimed to obtain materials for rapidly and easily forming optical waveguides that are excellent in terms of the above material properties.

That is, it is an object of the present invention to easily and inexpensively manufacture a material, and an optical waveguide formed using this materials, the material and the optical waveguide having the advantages that the waveguide loss is low for light having a wavelength in a broad range from the visible region to the near infrared region, and moreover the cracking resistance, the thermal resistance, the patterning ability upon irradiation with radiation, and so on are excellent.

Moreover, it is another object of the present invention to provide an optical waveguide formation method according to which the before-mentioned optical waveguide can be formed through a simple process in a short time.

The present inventors carried out assiduous studies to resolve the above problems, and as a result discovered that a radiation-curable composition, which comprises siloxane oligomers having fluorine atom-containing non-hydrolyzable organic groups and a photoacid generator, is extremely good as a resin for forming an optical waveguide, thus accomplishing the present invention.

Specifically, a radiation-curable composition of the present invention is a radiation-curable composition which contains undermentioned components (A) and (B):

(A) at least one selected from the group consisting of hydrolyzates of hydrolyzable silane compounds represented by undermentioned general formula (1) and condensates of such hydrolyzates $$(R^1)_p(R^2)_q Si(X)_{4-p-q} \qquad (1)$$

[wherein in general formula (1), $R^1$ is a non-hydrolyzable organic group having 1 to 12 carbon atoms that contains fluorine atoms, $R^2$ is a non-hydrolyzable organic group having 1 to 12 carbon atoms (but excluding ones that contain fluorine atoms), X is a hydrolyzable group, p is an integer of 1 or 2, and q is an integer of 0 or 1]; and (B) a photoacid generator;

and wherein the content of silanol (Si—OH) groups out of all the bonding groups on Si in the composition is 10 to 50%.

If a radiation-curable composition having such a constitution is used, then an optical waveguide can be formed easily and inexpensively, while exhibiting excellent patterning ability and so on upon irradiation with radiation. Moreover, the optical waveguide will have low waveguide loss for light having a wavelength in a broad range from the visible region to the near infrared region, and moreover excellent properties such as cracking resistance and thermal resistance.

Here, as component (A), for example one having therein at least one structure selected from the group consisting of structures represented by undermentioned general formulae (2) and (3) can be used.

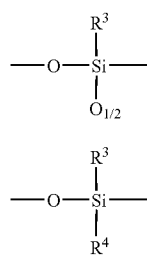

[In general formulae (2) and (3), $R^3$ is a non-hydrolyzable organic group having 1 to 12 carbon atoms that contains fluorine atoms, and $R^4$ is a non-hydrolyzable organic group having 1 to 12 carbon atoms that optionally contains fluorine atoms, and may be the same as $R^3$].

Moreover, as $R^1$ in general formula (1), for example a group represented by $CF_3(CF_2)_n(CH_2)_m$ [wherein m is an integer from 0 to 5, n is an integer from 1 to 11, and m+n is from 1 to 11] can be used.

Moreover, as component (A), one further having therein at least one structure selected from the group consisting of structures represented by undermentioned general formulae (4) and (5) can be used.

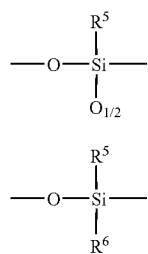

[In general formulae (4) and (5), $R^5$ is a phenyl group or a fluorinated phenyl group, and $R^6$ is a non-hydrolyzable organic group having 1 to 12 carbon atoms that optionally contains fluorine atoms, and may be the same as $R^5$].

The radiation-curable composition of the present invention may be constituted such that the amount of the photoacid generator (B) to be added per 100 parts by weight of the component (A) is 0.01 to 15 parts by weight.

An optical waveguide formation method of the present invention is a method of forming an optical waveguide having a lower clad layer, a core portion formed on a part of the region of the lower clad layer, and an upper clad layer formed on the lower clad layer such as to cover the core portion, characterized by applying on at least one selected from the lower clad layer, the core portion and the upper clad layer using a radiation-curable composition as described above as a material, and then irradiating with irradiation, thus forming the optical waveguide.

An optical waveguide of the present invention is an optical waveguide having a lower clad layer, a core portion formed on a part of region of the lower clad layer, and an upper clad layer formed on the lower clad layer such as to cover the core portion, characterized in that at least one selected from the lower clad layer, the core portion and the upper clad layer comprises a radiation-curable composition as described above.

According to the radiation-curable composition of the present invention, an optical waveguide can be manufactured that has a low waveguide loss of not more than 0.5 dB/cm for light in a broad range of the near infrared region, and moreover is excellent in terms of the long-term stability of the low waveguide loss.

Moreover, according to the radiation-curable composition of the present invention, an optical waveguide can be manufactured that has excellent transparency and thermal resistance, for which interfacial peeling does not occur and cracking inside the waveguide is not brought about, and that has excellent shape precision.

Furthermore, according to the optical waveguide formation method of the present invention, an optical waveguide that has low waveguide loss and moreover is excellent in terms of patterning ability, cracking resistance and so on can be formed through a simple process in a short time. Therefore optical waveguides that can be suitably used in the manufacture of optical circuits used in optical communication systems can be provided inexpensively.

BEST MODE FOR CARRYING OUT THE INVENTION

Figure 1:
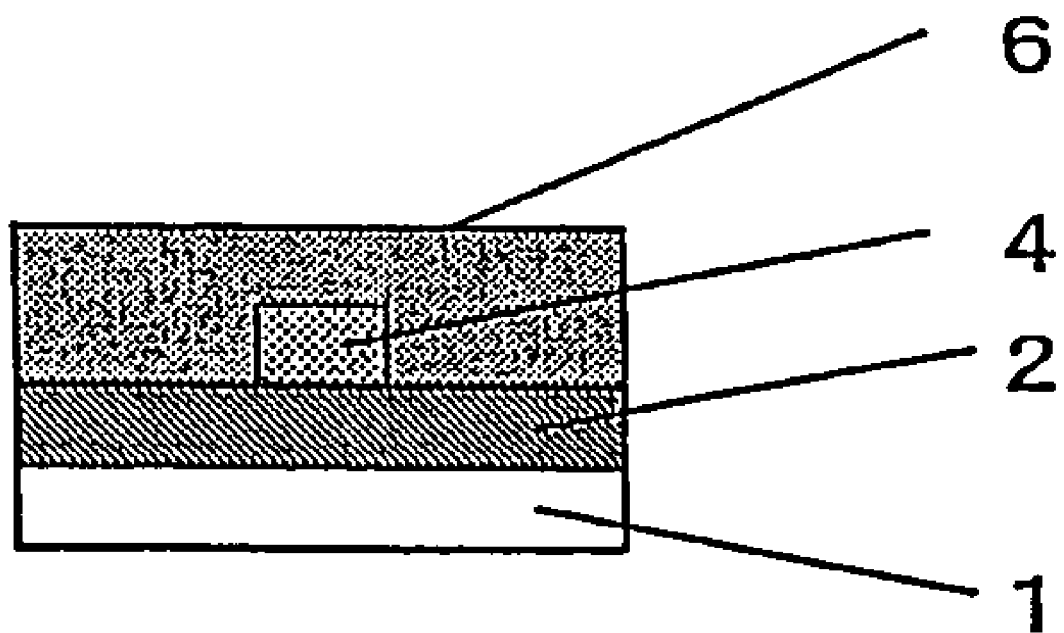
FIG. 1 is a sectional view showing schematically an example of an optical waveguide of the present invention.

Following is a more detailed description of the present invention.

[Component (A)]

Component (A) in the present invention comprises at least one selected from the group consisting of hydrolyzates of hydrolyzable silane compounds represented by undermentioned general formula (1) and condensates of these hydrolyzates, and preferably has a silanol group content of 1 to 10 mmol/g. Here, hydrolyzates of hydrolyzable silane compounds includes not only, for example, a product obtained through alkoxy groups being converted into silanol groups through a hydrolysis reaction, but also a partial condensate obtained through some of the silanol groups undergoing condensation with one another or the silanol groups undergoing condensation with alkoxy groups.

$$(R^1)_p(R^2)_q Si(X)_{4-p-q} \quad (1)$$

[In general formula (1), $R^1$ is a non-hydrolyzable organic group having 1 to 12 carbon atoms that contains fluorine atoms, $R^2$ is a non-hydrolyzable organic group having 1 to 12 carbon atoms, X is a hydrolyzable group, p is an integer of 1 or 2, and q is an integer of 0 or 1.]

Component (A) can generally be obtained by heating hydrolyzable silane compounds represented by before-mentioned general formula (1), or a mixture of such hydrolyzable silane compounds and hydrolyzable silane compounds other than those represented by general formula (1). Through the heating, the hydrolyzable silane compounds are hydrolyzed to form a hydrolyzate, with this hydrolyzate optionally further undergoing a condensation reaction, whereby component (A) is produced.

(1) Organic Group $R^1$

The organic group $R^1$ in general formula (1) is non-hydrolyzable organic group having 1 to 12 carbon atoms containing at least one fluorine atoms. Here, 'non-hydrolyzable' means a property of stably remaining as it is under conditions under which the hydrolyzable group X is hydrolyzed. Examples of such non-hydrolyzable organic groups include fluorinated alkyl groups and fluorinated aryl groups. Examples of specific fluorinated alkyl groups include trifluoromethyl groups, trifluoropropyl groups, heptadecafluorodecyl groups, tridecafluorooctyl groups, and nonafluorohexyl groups. Moreover, examples of specific fluorinated aryl groups include pentafluorophenyl groups.

Of these, fluorinated alkyl groups represented by $C_nF_{2n+1}C_mH_{2m}$ [wherein m is an integer from 0 to 5, n is an integer from 1 to 12, and m+n is from 1 to 12] are more preferable. Fluorinated alkyl groups, which have high fluorine contents and have long chains, such as heptadecafluorodecyl groups, tridecafluorooctyl groups and nonafluorohexyl groups are particularly preferable.

The subscript p in general formula (1) is an integer of 1 or 2, but is preferably 1.

(2) Organic Group $R^2$

The organic group $R^2$ in general formula (1) is a non-hydrolyzable organic group having 1 to 12 carbon atoms (but excluding ones that contain fluorine atoms). As $R^2$, a non-polymerizable organic group and a polymerizable organic group or one of these can be selected.

Here, examples of non-polymerizable organic groups include alkyl groups, aryl groups, aralkyl groups, and such groups that have been halogenated or deuterated. These may be straight chain, branched, cyclic, or a combination thereof.

Examples of alkyl groups include a methyl group, an ethyl group, a propyl group, a butyl group, a hexyl group, a cyclohexyl group and an octyl group. Examples of preferable halogen atoms include fluorine, chlorine, bromine and iodine.

Moreover, examples of aryl groups among the non-polymerizable organic groups include a phenyl group, atolyl group, a xylyl group, a naphthyl group, a biphenyl group, deuterated aryl groups, and halogenated aryl groups.

Moreover, examples of aralkyl groups include a benzyl group and a phenylethyl group.

Furthermore, as a non-polymerizable organic group, a group having a structural unit containing a hetero atom may be used. Examples of such structural units include ether linkages, ester linkages, sulfide linkages and so on. Moreover, in the case of containing a hetero atom, it is preferable for the non-polymerizable organic group to be non-basic.

On the other hand, a polymerizable organic group is preferably an organic group having one or both of a radical-polymerizable functional group and a cationic-polymerizable functional group in the molecule. By introducing such a functional group, radical polymerization or cationic polymerization can be made to occur, whereby the composition can be cured more effectively.

Moreover, out of a radical-polymerizable functional group and a cationic-polymerizable functional group in the polymerizable organic group, a cationic-polymerizable functional group is more preferable. This is because through the photoacid generator, not only the curing reaction for the silanol groups can be made to occur, but also the curing reaction for the cationic-polymerizable functional group can be made to occur at the same time.

Here, the subscript q in general formula (1) is an integer of 0 or 1, but is preferably 0.

(3) Hydrolyzable Group X

X in general formula (1) is a hydrolyzable group. Here 'hydrolyzable group' is generally a group that can be hydrolyzed to produce a silanol group, or a group that can form a siloxane condensate, upon heating for 1 to 10 hours within a temperature range of 0 to 150° C. in the presence of a catalyst and excess water at 1 atm.

Here, examples of the catalyst are acid catalysts and alkali catalysts. Examples of acid catalysts include monohydric and polyhydric organic acids and inorganic acids, and Lewis acids. Examples of organic acids include formic acid, acetic acid and oxalic acid. Examples of Lewis acids include metallic compounds, alkoxides, carboxylates, and inorganic salts of Ti, Zr, Al, B and so on. Examples of alkali catalysts include hydroxides of alkali metals or alkaline earth metals, amines, acidic salts, and basic salts. The amount of the catalyst required for the hydrolysis is preferably 0.001 to 5%, more preferably 0.002 to 1%, relative to the total amount of the silane compounds.

Examples of the hydrolyzable group X include a hydrogen atom, alkoxy groups having 1 to 12 carbon atoms, halogen atoms, an amino group, and acyloxy groups.

Here, preferable examples of alkoxy groups having 1 to 12 carbon atoms include a methoxy group, an ethoxy group, a propoxy group, a butoxy group, a phenoxy benzyloxy group, a methoxyethoxy group, an acetoxyethoxy group, a 2-(meth) acryloxyethoxy group, a 3-(meth) acryloxypropoxy group and a 4-(meth) acryloxybutoxy group, and also epoxy-group-containing alkoxy groups such as a glycidyloxy group and a 2-(3,4-epoxycyclohexyl)ethoxy group, oxetanyl-group-containing alkoxy groups such as a methyl-oxetanylmethoxy group and an ethyl-oxetanylmethoxy group, and 6-member ring ether groups such as an oxa-cyclohexyloxy group.

Moreover, preferable halogen atoms include fluorine, chlorine, bromine and iodine.

In the case of using a hydrolyzable silane compound containing a halogen atom as a hydrolyzable group, it is necessary to take care that the storage stability of the composition is not reduced. That is, although dependent on the amount of hydrogen halide produced through the hydrolysis, it is preferable to remove this hydrogen halide through an operation such as neutralization or distillation so that there will be no adverse effect on the storage stability of the composition.

(4) Examples of Hydrolyzable Silane Compounds Represented by General Formula (1)

Examples of hydrolyzable silane compounds represented by general formula (1) include trifluoromethyltrimethoxysilane, trifluoromethyltriethoxysilane, 3,3,3-trifluoropropyltrichlorosilane, methyl-3,3,3-trifluoropropyldichlorosilane, dimethoxymethyl-3,3,3-trifluoropropylsilane, 3,3,3-trifluoropropyltrimethoxysilane, 3,3,3-trifluoropropylmethyldichlorosilane, 3,3,4,4,5,5,6,6,6-nonafluorohexyltrichlorosilane, 3,3,4,4,5,5,6,6,6-nonafluorohexylmethyldichlorosilane, 3,3,4,4,5,5,6,6,7,7,8,8,9,9,10,10,10-heptadecafluorodecyltrichlorosilane, 3,3,4,4,5,5,6,6,7,7,8,8,9,9,10,10,10-heptadecafluorodecyltrimethoxysilane, 3,3,4,4,5,5,6,6,7,7,8,8,9,9,10,10,10-heptadecafluorodecyltriethoxysilane, 3,3,4,4,5,5,6,6,7,7,8,8,9,9,10,10,10-heptadecafluorodecylmethyldichlorosilane, 3-heptafluoroisopropoxypropyltriethoxysilane, pentafluorophenylpropyltrimethoxysilane, and pentafluorophenylpropyltrichlorosilane. Of these, for example 3,3,4,4,5,5,6,6,7,7,8,8,9,9,10,10,10-heptadecafluorodecyltriethoxysilane, 3,3,4,4,5,5,6,6,7,7,8,8,9,9,10,10,10-heptadecafluorodecyltrimethoxysilane, and 3,3,4,4,5,5,6,6,6-nonafluorohexyltrichlorosilane are preferable.

(5) Other Hydrolyzable Silane Compounds

Examples of hydrolyzable silane compounds other than the above include silane compounds having four hydrolyzable groups such as tetrachlorosilane, tetraaminosilane, tetraacetoxysilane, tetramethoxysilane, tetraethoxysilane, tetrabutoxysilane, tetraphenoxysilane, tetrabenzyloxysilane, trimethoxysilane and triethoxysilane; silane compounds having three hydrolyzable groups such as methyltrichlorosilane, methyltrimethoxysilane, methyltriethoxysilane, methyltributoxysilane, ethyltrimethoxysilane, ethyltriisopropoxysilane, ethyltributoxysilane, butyltrimethoxysilane, phenyltrimethoxysilane, phenyltriethoxysilane and deuterated methyltrimethoxysilane; and silane compounds having two hydrolyzable groups such as dimethyldichlorosilane, dimethyldiaminosilane, dimethyldiacetoxysilane, dimethyldimethoxysilane, diphenyldimethoxysilane, diphenyldiethoxysilane and dibutyldimethoxysilane.

(6) Preparation of Component (A)

There are no particular limitations on the method of heating the hydrolyzable silane compounds represented by general formula (1) to obtain component (A), so long as the silanol group content, described later, is not made to be too high or too low. One example of the method is a method comprising undermentioned steps 1) to 3). Some unhydrolyzed hydrolyzable groups may remain in the hydrolyzate of the hydrolyzable silane compounds represented by general formula (1). In this case, component (A) will be a mixture of hydrolyzable silane compounds and a hydrolyzate.

1) The hydrolyzable silane compounds represented by general formula (1) and an acid catalyst are put into a vessel equipped with a stirrer.
2) Next, organic solvent is further put into the vessel while adjusting the viscosity of the solution obtained, thus obtaining a mixed solution.
3) While stirring the mixed solution obtained in an air atmosphere at a temperature less than the boiling point of the organic solvent or the hydrolyzable silane compounds, water is instilled in, and then heating and stirring are carried out for 1 to 24 hours at 0 to 150° C. During the heating and stirring, it is preferable to concentrate the mixed solution through distillation, or replace the organic solvents as required. Here, to adjust the refractive index of the final cured material, the curability of the composition, the viscosity, and so on, hydrolyzable silane compounds other than the hydrolyzable silane compounds represented by general formula (1) can be mixed in, whereby a siloxane oligomer is prepared. In this case, after the hydrolyzable silane compounds other than the hydrolyzable silane compounds represented by general formula (1) have been added and mixing has been carried out in step 1) above, reaction can be brought about by heating.

Silanol groups are produced in the process of preparing component (A). Depending on the preparation method, the amount of silanol groups produced may deviate from the range stipulated in the present invention. In this case, the waveguide loss of the optical waveguide may increase, or there may be unfavorable effects on patterning of the core portion by photolithography or the like. It is thus preferable for the process for preparing component (A) to follow the method described above.

(7) Preferable form of component (A)

Component (A) preferably has at least one structure selected from the group consisting of structures represented by undermentioned general formulae (2) and (3).

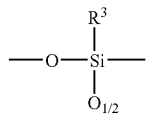

(2)

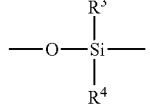

(3)

[In general formulae (2) and (3), $R^3$ is a non-hydrolyzable organic group having 1 to 12 carbon atoms that contains fluorine atoms, and $R^4$ is a non-hydrolyzable organic group having 1 to 12 carbon atoms that optionally contains fluorine atoms, and may be the same as $R^3$].

If component (A) has at least one structure as described above, then material properties such as the cracking resistance of an optical waveguide manufactured from the radiation-curable composition of the present invention can be further improved.

Furthermore, $R^1$ in general formula (1) is preferably $CF_3(CF_2)_n(CH_2)_m$ [wherein m is an integer from 0 to 5, n is an integer from 1 to 11, and m+n is from 1 to 11]. If $R^1$ has such a structure, the patterning ability when an optical waveguide is manufactured through photolithography using the radiation-curable composition of the present invention, the cracking resistance of the optical waveguide, the waveguide loss and so on can be further improved.

In the case that $R^1$ has a structure as described above, component (A) preferably further has at least one structure selected from the group consisting of structures represented by undermentioned general formulae (4) and (5)

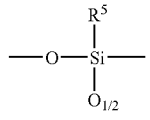

(4)

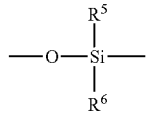

(5)

[In general formulae (4) and (5), $R^5$ is a phenyl group or a fluorinated phenyl group, and $R^6$ is a non-hydrolyzable organic group having 1 to 12 carbon atoms that optionally contains fluorine atoms, and may be the same as $R^5$].

Examples of hydrolyzable compounds constituting a structure represented by general formula (4) or general formula (5) include compounds having a phenyl group or a fluorinated phenyl group among the examples of hydrolyzable silane compounds represented by general formula (1) or hydrolyzable silane compounds other than those represented by general formula (1) Out of these, phenyltrimethoxysilane, phenyltriethoxysilane, pentafluorophenyltrimethoxysilane and so on are particularly preferable.

If component (A) has a structure as described above, then the thermal resistance and the patterning ability of an optical waveguide formed using the radiation-curable composition of the present invention can be further improved.

[Component (B)]

Component (B) comprises a photoacid generator. Upon being irradiated with radiation, component (B) is decomposed, and discharges an acidic active substance for photocuring component (A).

Here, examples of the radiation include visible light, ultraviolet radiation, infrared radiation, X-rays, an electron beam, a-rays and y-rays. From the viewpoint of the energy level being at a certain value or more, the curing rate being high, and the irradiation apparatus being relatively inexpensive and small, it is preferable to use ultraviolet radiation.

Examples of component (B) include onium salts having a structure represented by undermentioned general formula (6), and sulfonic acid derivatives having a structure represented by undermentioned general formula (7).

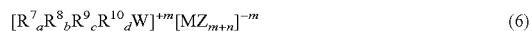
(6)

(In general formula (6), the cation is an onium ion; W is S, Se, Te, P, As, Sb, Bi, O, I, Br, Cl or —N≡N; $R^7$, $R^8$, $R^9$ and $R^{10}$ are the same organic group or different organic groups; each of a, b, c and d is an integer from 0 to 3, with (a+b+c+d) being equal to the valency of W. M is a metal or metalloid constituting the central atom of the halide complex [$MZ_{m+n}$], for example B, P, As, Sb, Fe, Sn, Bi, Al, Ca, In, Ti, Zn, Sc, V, Cr, Mn or Co. Z is a halogen atom such as F, Cl or Br, or an aryl group, m is the net charge on the halide complex ion, and n is the valency of M.)

(7)

[In general formula (7), Q is a monovalent or bivalent organic group, $R^{11}$ is a monovalent organic group having 1 to 12 carbon atoms, the subscript s is 0 or 1, and the subscript t is 1 or 2.]

(1) Onium Salts

Examples of the anion [$MZ_{m+n}$] in general formula (6) include tetrafluoroborate ($BF_4^-$), hexafluorophosphate ($PF_6^-$), hexafluoroantimonate ($SbF_6^-$), hexafluoroarsenate ($AsF_6^-$), hexachloroantimonate ($SbCl_6^-$), tetraphenylborate, tetrakis(trifluoromethylphenyl)borate and tetrakis(pentafluoromethylphenyl)borate.

Moreover, it is also favorable to use an anion represented by the general formula [$MZ_nOH$] instead of the anion [$MZ_{m+n}$] in general formula (6). Furthermore, an onium salt having another anion such as a perchlorate ion ($ClO_4^-$), a trifluoromethanesulfonate ion ($CF_3SO_4^-$), a fluorosulfonate ion ($FSO_4^-$), a toluenesulfonate ion, a trinitrobenzenesulfonate anion or a trinitrotoluenesulfonate anion can be used.

Moreover, aromatic onium salts are preferable as the onium salts. Triaryl sulfonium salts, compounds represented by undermentioned general formula (8), diaryl iodonium salts represented by undermentioned general formula (9), and triaryl iodonium salts are particularly preferable.

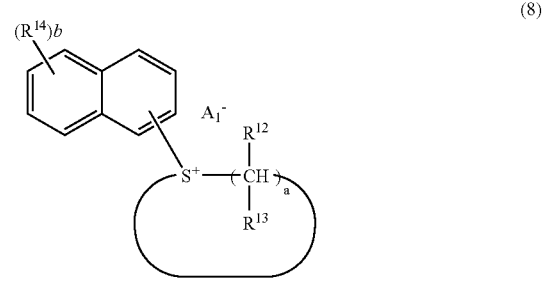
(8)

[In general formula (8), each of $R^{12}$ and $R^{13}$ represents independently a hydrogen atom or an alkyl group; $R^{14}$ represents a hydroxyl group or —$OR^{15}$ (wherein $R^{15}$ is a monovalent organic group); a is an integer from 4 to 7; and b is an integer from 1 to 7. There are no particular limitations on the bonding positions of the substiuents on the naphthalene ring.]

(9)

[In general formula (9), each of $R^{16}$ and $R^{17}$ is a monovalent organic group, and may be the same or different, with at least one of $R^{16}$ and $R^{17}$ having an alkyl group having four or more carbon atoms; each of $Ph^1$ and $Ph^2$ is an aromatic group, and may be the same or different; and $Y^-$ is a monovalent anion, being an anion selected from group III and group V fluoride anions, $ClO_4^-$, and $CF_3SO_3^-$.

Examples of compounds represented by general formula (8) include 4-hydroxy-1-naphthyltetrahydrothiophenium trifluoromethanesulfonate, 4-butoxy-1-naphthyltetrahydrothiophenium trifluoromethanesulfonate, 4,7-dihydroxy-1-naphthyltertrahydrothiophenium trifluoromethanesulfonate and 4,7-di-ti-butoxy-1-naphthyltetrahydrothiophenium trifluoromethanesulfonate.

Furthermore, examples of diaryl iodonium salts include (4-n-decyloxyphenyl)phenyliodonium hexafluoroantimonate, [4-(2-hydroxy-n-tetradecyloxy)phenyl]phenyliodonium hexafluoroantimonate, [4-(2-hydroxy-n-tetradecyloxy)phenyl]phenyliodonium trifluorosulfonate, [4-(2-hydroxy-n-tetradecyloxy)phenyl]phenyliodonium hexafluorophosphate, [4-(2-hydroxy-n-tetradecyloxy)phenyl]phenyliodonium tetrakis(pentafluorophenyl)borate, bis(4-t-butylphenyl)iodonium hexafluoroantimonate, bis(4-t-butylphenyl)iodonium hexafluorophosphate, bis(4-t-butylphenyl)iodonium trifluorosulfonate, bis(4-t-butylphenyl)iodonium tetrafluoroborate, bis(dodecylphenyl)iodonium hexafluoroantimonate, bis(dodecylphenyl)iodonium tetrafluoroborate, bis(dodecylphenyl)iodonium hexafluorophosphate and bis(dodecylphenyl)iodonium trifluoromethylsulfonate. It is possible to use one such diaryl iodonium salt or a combination of two or more.

(2) Sulfonic Acid Derivative

Examples of the sulfonic acid derivatives represented by general formula (7) include disulfones, disulfonyl diazomethane derivatives, disulfonyl methane derivatives, sulfonyl benzoyl methane derivatives, imidosulfonates, benzoin sulfonates, 1-oxy-2-hydroxy-3-propyl alcohol sulfonates, pyrogallol trisulfonates and benzyl sulfonates.

Out of these, imidosulfonates are preferable, and trifluoromethylsulfonate derivatives are more preferable.

There are no particular limitations on the amount of the photoacid generator (B), but this amount is generally 0.01 to 15 parts by weight per 100 parts by weight of component (A). If the amount of the photoacid generator is less than 0.1 parts by weight, then there may be a tendency for the photo-curability to drop, and hence it may not be possible to obtain a sufficient curing rate. On the other hand, if the amount of the photoacid generator exceeds 15 parts by weight, then there may be a tendency for the weather resistance and thermal resistance of the cured material to drop.

From the viewpoint of making the balance between the photo-curability and the weather resistance and so on of the cured material obtained yet better, the amount of the photoacid generator as component (B) is preferably made to be a value within a range of 0.1 to 10 parts by weight per 100 parts by weight of component (A).

[Component (C)]

The radiation-curable composition of the present invention can have good storage stability and a suitable viscosity, and can form an optical waveguide having a uniform thickness by being mixed in an organic solvent (C).

Examples of the organic solvent (C) include ether type organic solvents, ester type organic solvents, ketone type organic solvents, hydrocarbon type organic solvents, and alcohol type organic solvents. In general, it is preferable to use an organic solvent that has a boiling point under atmosphere pressure within a range of 50 to 200° C., and which can dissolve the components of the composition uniformly.

Examples of such organic solvents include aliphatic hydrocarbon type solvents, aromatic hydrocarbon type solvents, monoalcohol type solvents, polyalcohol type solvents, ketone type solvents, ether type solvents, ester type solvents, nitrogen-containing solvents, sulfur-containing solvents and so on can be used. One of these organic solvents can be used alone, or two or more can be used in combination.

Out of these organic solvents (C), alcohols and ketones are preferable. This is because the storage stability of the composition can be further improved.

Moreover, an example of particularly preferable organic solvent is at least one compound selected from the group consisting of propylene glycol monomethyl ether, ethyl lactate, methyl isobutyl ketone, methyl amyl ketone, toluene, xylene, and methanol.

Moreover, the type of the organic solvent (C) is preferably selected while considering the method of applying the composition. For example, because a thin film having a uniform thickness can easily be obtained, it is preferable to use the spin coating method. As an organic solvent used in this case, it is preferable to use a glycol ether such as ethylene glycol monoethyl ether or propylene glycol monomethyl ether; an ethylene glycol alkyl ether acetate such as ethyl cellosolve acetate, propylene glycol methyl ether acetate or propylene glycol ethyl ether acetate, an ester such as ethyl lactate or ethyl 2-hydroxypropionate; a diethylene glycol derivative such as diethylene glycol monomethyl ether, diethylene glycol dimethyl ether or diethylene glycol ethyl methyl ether; a ketone such as methyl isobutyl ketone, 2-heptanone, cyclohexanone or methyl amyl ketone, or the like. It is particularly preferable to use ethyl cellosolve acetate, propylene glycol methyl ether acetate, ethyl lactate, methyl isobutyl ketone or methyl amyl ketone.

The amount of component (C) is 1 to 300 parts by weight, preferably 2 to 200 parts by weight, per 100 parts by weight of component (A). If this amount is within a range of 1 to 300 parts by weight, then the storage stability of the composition can be improved, and moreover the composition can be given a suitable viscosity, and hence an optical waveguide having a uniform thickness can be formed.

There are no particular limitations on the method of adding the organic solvent (C). For example, the organic solvent (C) may be added when component (A) is being manufactured, or may be added when component (A) and component (B) are being mixed together.

[Silanol Group Content in Composition]

The content of silanol groups out of all the bonding groups on Si in the radiation-curable composition of the present invention must be 10 to 50% (preferably 20 to 40%). If the content of silanol groups deviates from this range, then it may not be possible to obtain patterning in the desired shape upon carrying out alkaline developing, or the waveguide loss of the formed optical waveguide may be increased.

[Other Components]

It is favorable to further blend in acid diffusion controlling agents, reactive diluents, radical generators (photopolymerization initiators), photosensitizers, metal alkoxides, inorganic fine particles, dehydrating agents, leveling agents, polymerization inhibitors, polymerization initiation auxiliaries, wettability improvers, surfactants, plasticizers, ultraviolet absorbers, antioxidants, antistatic agents, silane coupling agents, macromolecular additives and so on, provided that the objects and effects of the present invention are not impaired.

(D) Acid Diffusion Controlling Agent

An acid diffusion controlling agent, which is component (D), is defined as a compound capable of controlling diffusion of acidic active substance, which generates from the photoacid generator upon irradiation with light, through the coating film, thus suppressing the curing reaction in unexposed regions. To distinguish an acid diffusion controlling agent, which is component (D), from a photoacid generator, an acid diffusion controlling agent is defined as a compound not having an acid generating function.

By adding such an acid diffusion controlling agent, the photo-curable composition can be cured effectively, and the pattern precision can be improved.

As the type of the acid diffusion controlling agent, which is component (D), a nitrogen-containing organic compound, the basicity of which does not change upon exposure to light or heat treatment during the film formation process, is preferable.

Examples of such nitrogen-containing organic compounds include, for example, compounds represented by undermentioned general formula (10).

$$NR^{18}R^{19}R^{20} \tag{10}$$

[In general formula (10), each of $R^{18}$, $R^{19}$ and $R^{20}$ represents independently a hydrogen atom, a substituted or unsubstituted alkyl group, a substituted or unsubstituted aryl group, or a substituted or unsubstituted aralkyl group.]

Moreover, examples of other nitrogen-containing organic compounds include diamino compounds having two nitrogen atoms in the same molecule, diamino polymers having three or more nitrogen atoms, and also amide group-containing compounds, urea compounds, and nitrogen-containing heterocyclic compounds.

Examples of nitrogen-containing organic compounds include monoalkylamines such as n-hexylamine, n-heptylamine, n-octylamine, n-nonylamine and n-decylamine; dialkylamines such as di-n-butylamine, di-n-pentylamine, di-n-hexylamine, di-n-heptylamine, di-n-octylamine, di-n-nonylamine and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine and tri-n-decylamine; aromatic amines such as aniline, N-methylaniline, N,N-dimethylaniline, 2-methylaniline, 3-methylaniline, 4-methylaniline, 4-nitroaniline, diphenylamine, triphenylamine and 1-naphthylamine; and alkanolamines such as ethanolamine, diethanolamine and triethanolamine.

One acid diffusion controlling agent can be used alone, or two or more can be used mixed together.

The amount of the acid diffusion controlling agent (D) is preferably within a range of 0.001 to 15 parts by weight per 100 parts by weight of component (A).

The reasons for this are as follows. If the amount of the acid diffusion controlling agent is less than 0.001 parts by weight, then depending on the process conditions, the pattern shape and the dimensional reproducibility of the optical waveguide may become poor. On the other hand, if the amount of the acid diffusion controlling agent exceeds 15 parts by weight, then the photo-curability of component (A) may drop.

It is thus preferable to make the amount of the acid diffusion controlling agent be a value within a range of 0.001 to 10 parts by weight, more preferably 0.005 to 5 parts by weight, per 100 parts by weight of component (A).

Radiation-curable compositions of the present invention can be used as a lower layer composition, a core composition and an upper layer composition for forming the lower clad layer, the core portion and the upper clad layer constituting an optical waveguide.

As the lower layer composition, the core composition and the upper layer composition, different resin compositions can be used, this being such that the relationship between the refractive indexes of these parts finally obtained satisfies the conditions required for the optical waveguide. It is preferable for the lower layer composition and the upper layer composition to be the same resin composition, because the formation of the optical waveguide and so on becomes easier.

By selecting the type of component (A) in the radiation-curable composition of the present invention, an optical waveguide comprising a core portion and lower and upper clad layers having different refractive indexes can easily be formed. It is thus preferable to select two or more resin compositions such that the refractive index difference therebetween is suitable, and then, for example, use a resin composition for which a high refractive index is obtained as the core composition, and use a resin composition for which a lower refractive index than that of the core composition is obtained as the lower layer composition and the upper layer composition.

Moreover, the viscosity of a radiation-curable composition of the present invention is preferably 5 to 5,000 mPa.s, more preferably 10 to 1,000 mPa.s, at 25° C. If the viscosity exceeds 5,000 mPa.s, then it may be difficult to form a uniform coating film. The viscosity of the resin composition can be adjusted by regulating the amount of a reactive diluent and an organic solvent.

Next, a description will be given of a method of forming an optical waveguide using the radiation-curable composition of the present invention. This method is constituted primarily from a lower clad layer formation step, a core portion formation step, and an upper clad layer formation step. Following is a detailed description, with reference to FIG. 1. FIG. 1 is a sectional view showing schematically an example of an optical waveguide of the present invention.

In the following description, a radiation-curable composition of the present invention is used for each of the lower clad layer 2, the core portion 4 and the upper clad layer 6.

However, for example, a radiation-curable composition of the present invention may be used for only the core portion 4. In this case, a publicly known optical waveguide material such as quartz glass can be used for the lower clad layer 2 and the upper clad layer 6.

In the optical waveguide having the above constitution, there are no particular limitations on the thicknesses of the lower clad layer 2, the upper clad layer 6 and the core portion 4, but for example it is preferable to make the thickness of the lower clad layer 2 be a value within a range of 3 to 50 µm, the thickness of the core portion 4 be a value within a range of 3 to 20 µm, and the thickness of the upper clad layer 6 be a value within a range of 3 to 50 µm.

Moreover, there are no particular limitations on the width of the core portion 4 in the direction perpendicular to the light waveguiding direction, but it is preferable, for example, to make this width have a value within a range of 1 to 50 µm.

Figure 2:
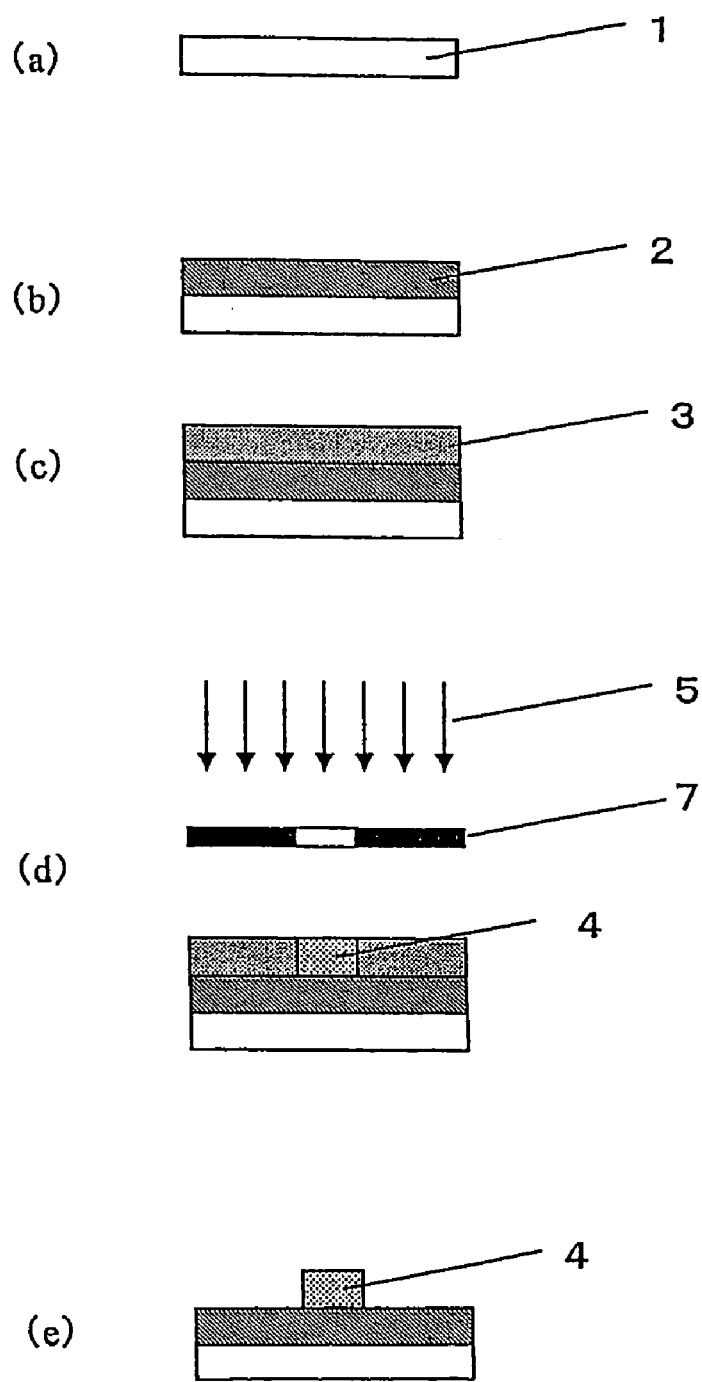
FIG. 2 is a flowchart showing an example of an optical waveguide formation method of the present invention.

Next, a description will be given of an optical waveguide formation method of the present invention. FIG. 2 is a flowchart showing an example of an optical waveguide formation method of the present invention.

In the present invention, the optical waveguide is formed through steps (a) to (e) as shown in FIG. 2. That is, each of the lower clad layer 2, the core portion 4 and the upper clad layer 6 (not shown in FIG. 2—see FIG. 1) is preferably formed by applying a photo-curable composition for optical waveguide formation for forming that layer, and then photo-curing.

In the following formation example, description is given assuming that the lower clad layer 2, the core portion 4 and the upper clad layer 6 are formed respectively from a lower layer composition, a core composition and an upper layer composition. These compositions are photo-curable compositions for optical waveguide formation from which cured materials of different refractive indices are obtained after curing.

(1) Preparation of Substrate

First, as shown in FIG. 2(a), a substrate 1 having a flat surface is prepared. There are no particular limitations on the type of the substrate 1, but for example a silicon substrate, a glass substrate or the like can be used.

(2) Lower Clad Layer Formation Step

This is a step of forming the lower clad layer 2 on the surface of the prepared substrate 1. Specifically, as shown in FIG. 2(b), the lower layer composition is applied onto the surface of the substrate 1, and dried or prebaked to form a lower layer thin film. The lower layer thin film is then cured by being irradiated with light, whereby the lower clad layer 2 can be formed.

There are no particular limitations on the light for forming the core layer and the clad layers, but in general, light from the ultraviolet to visible region of wavelength 200 to 450 nm, preferably light containing ultraviolet radiation of wavelength 365 nm is used. The irradiation at wavelength 200 to 450 nm is carried out such that the intensity is 1 to 1000 mW/cm$^2$, and the irradiation dose is 0.01 to 5000 mJ/cm$^2$, preferably 0.1 to 1000 mJ/cm$^2$, thus carrying out exposure.

Here, as the type of the irradiated light, visible light, ultraviolet radiation, infrared radiation, X-rays, α-rays, β-rays, γ-rays and so on can be used, but due to the industrial versatility of the light source, a wavelength of 200 to 400 nm is preferable, and irradiation containing ultraviolet radiation of wavelength 365 nm is particularly preferable. Moreover, it is possible to use, for example, an irradiation apparatus, in which light from either or both of a lamp light source that irradiates a wide area simultaneously such as a high-pressure mercury lamp, a low-pressure mercury lamp, a metal halide lamp or an excimer lamp, and a laser light source that emits light as pulses or continuous emission, is converged using mirrors, lenses or optical fibers.

In the case of forming the optical waveguide using convergent light, the exposure can be carried out to give the shape of the optical waveguide by moving either the convergent light or the irradiated object. Of the before-mentioned light sources, a light source having high ultraviolet radiation intensity at 365 nm is preferable. For example, a high-pressure mercury lamp is preferable as a lamp light source, and an argon laser is preferable as a laser light source.

In the step of forming the lower clad layer 2, it is preferable to irradiate the whole of the thin film with light, thus curing the whole of the thin film.

Here, as the method of applying the lower layer composition, a method such as a spin coating method, a dipping method, a spraying method, a bar coating method, a roll coating method, a curtain coating method, a gravure printing method, a silk screen method, or an ink jet method can be used. Of these, it is particularly preferable to use the spin coating method, because a lower layer thin film of particularly uniform thickness can be obtained.

Moreover, to make the Theological properties of the lower layer composition suitably match the application method, it is possible to blend in additives other than surface-tension reducing agents as required.

Moreover, it is preferable to prebake the lower layer thin film comprising the lower layer composition at 50 to 200° C. after the application.

The application method, the rheological property improving method and so on in the lower clad layer formation step can also be used in the core portion formation step and the upper clad layer formation step described below.

Moreover, after the exposure, to cure the whole of the coating film sufficiently, it is preferable to further carry out heating treatment (hereinafter referred to as 'post-baking'). The heating conditions will vary according to the composition of the photo-curable composition for optical waveguide formation, the types of additives, and so on, but it is generally preferable to make the heating time be, for example, 5 minutes to 72 hours, and the heating temperature be at 30 to 400° C., preferably 50 to 300° C.

The irradiation dose and type of the light, the irradiation apparatus and so on in the lower clad layer formation step can also be used in the core portion formation step and the upper clad layer formation step described below.

(3) Formation of Core Portion

Next, as shown in FIG. 2(*c*), the core composition is applied onto the lower clad layer 2, and dried or further prebaked to form a core thin film 3.

After that, as shown in FIG. 2(*d*), radiation 5 is preferably irradiated onto the upper surface of the core thin film 3 following a prescribed pattern, for example via a photomask 7 having a prescribed line pattern.

As a result, only parts irradiated with the light are cured, and hence by developing and removing the remaining uncured parts using a developing solution, as shown in FIG. 2(*e*), a core portion 4 comprising a patterned cured film can be formed on the lower clad layer 2.

Here, the method of irradiating with light following a prescribed pattern is not limited to a method using a photomask comprising regions through which the light can pass and regions through which the light cannot pass. Examples of other methods include the following methods a to c.

a. A method using means for electrooptically forming a mask image comprising regions through which the light can pass and regions through which the light cannot pass following a prescribed pattern, using a similar principle to a liquid crystal display apparatus.

b. A method in which a light-guiding member comprising a bundle of many optical fibers is used, and irradiation with light is carried out via the optical fibers in accordance with a prescribed pattern in the light-guiding member.

c. A method in which laser light, or convergent light obtained using a converging optical system such as a lens or a mirror, is irradiated onto the photo-curable composition while being scanned.

After the exposure, to promote the curing of the exposed regions, it is preferable to carry out heating treatment (hereinafter referred to as 'PEB'). The heating conditions will vary according to the composition of the photo-curable composition for optical waveguide formation, the types of additives, and so on, but the temperature is generally 30 to 200° C., preferably 50 to 150° C.

On the other hand, before the exposure, merely by leaving the coating film comprising the photo-curable composition for optical waveguide formation for 1 to 10 hours at room temperature, the shape of the core portion can be made to be semicircular. In the case that one wishes to obtain a semicircular core portion, it is preferable to leave for several hours at room temperature before the exposure in this way.

The thin film that has been selectively cured by exposing with light following a prescribed pattern as described above can be developed utilizing the difference in solubility between the cured portions and the uncured portions. After the patterned exposure, it is thus possible to remove the uncured portions while leaving behind the cured portions, and as a result form the core portion.

Here, as the developing solution, it is possible to use a solution obtained by diluting a basic substance such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, ethanolamine, N-methylethanolamine, N,N-dimethylethanolamine, triethanolamine, tetramethylammonium hydroxide, tetraethylammonium hydroxide, tetrabutylammonium hydroxide, choline, pyrrole, piperidine, 1,8-diazabicyclo[5.4.0]-7-undecene or 1,5-diazabicyclo[4.3.0]-5-nonene with a solvent such as water, methanol, ethanol, propyl alcohol, butanol, octanol, propylene glycol monomethyl ether, propylene glycol monoethyl ether, N-methylpyrrolidone, formamide, N,N-dimethylformamide or N,N-dimethylacetoamide.

The concentration of the basic substance in the developing solution is generally made to be a value within a range of 0.05 to 25 wt %, preferably 0.1 to 3.0 wt %.

Moreover, the developing time is generally 30 to 600 seconds. As the developing method, a publicly known method such as a liquid mounting method, a dipping method, or a showering developing method can be used.

In the case of using an organic solvent as the developing solution, blow drying is carried out. In the case of using an alkaline aqueous solution, washing in running water is carried out for, for example, 30 to 90 seconds, and then blow drying is carried out using compressed air, compressed nitrogen or the like, whereby moisture is removed from the surface, and hence a patterned coating film can be formed.

Next, to further cure the patterned portions, post-baking is carried out, for example, at a temperature of 30 to 400° C. for 5 to 60 minutes using a heating apparatus such as a hot plate or an oven, whereby a cured core portion is formed.

For the core composition, it is preferable to use an aminopolysiloxane having higher amino group content than in the lower layer composition or the upper layer composition.

By adopting such a constitution, the pattern precision of the core portion can be further improved, and on the other hand for the lower layer composition and the upper layer composition, excellent storage stability can be obtained, and moreover curing can be carried out sufficiently with a relatively low irradiation dose.

(4) Formation of Upper Clad Layer

Next, the upper layer composition is applied onto the surface of the lower clad layer 2 on which the core portion 4 has been formed, and is dried or prebaked to form an upper layer thin film. The upper layer thin film is then cured by being irradiated with light, whereby an upper clad layer 6 as shown in FIG. 1 can be formed.

Moreover, the upper clad layer 6 obtained through the irradiation is preferably subjected to post-baking as described earlier as required. By carrying out post-baking, an upper clad layer having excellent thermal resistance and hardness can be obtained.

Moreover, with regard to the optical waveguide, it is necessary to make the refractive index of the core portion 4 be greater than the refractive index of the lower clad layer 2 and the upper clad layer 6. To obtain excellent waveguiding properties, it is preferable to make the refractive index of the core portion 4 be a value within a range of 1.450 to 1.650, and the refractive index of the lower clad layer 2 and the upper clad layer 6 be a value within a range of 1.400 to 1.648, for light of wavelength 1300 to 1600 nm.

Moreover, it is preferable to set the refractive index of the core portion 4 while considering the refractive index of the lower clad layer 2 and the upper clad layer 6. It is particularly preferable to make the refractive index of the core portion 4 be a value 0.002 to 0.5 greater than the value of the refractive index of the lower clad layer 2 and the upper clad layer 6.

EXAMPLES

Following is a description of examples of the present invention.

In the following, the present invention is described more concretely through Examples. However, the present invention is not limited to these Examples.

[Preparation of Component (A)]

Synthesis Example 1

Phenyltrimethoxysilane (30.79 g), 3,3,4,4,5,5,6,6,7,7,8,8, 9,9,10,10,10-heptadecafluorodecyl-triethoxy-silane (22.64 g), tetraethoxysilane (4.62 g), 1-methoxy-2-propanol (29.93 g), and oxalic acid (0.04 g) were added into a flask equipped with a stiffer and a reflux tube, and after stirring, the solution was heated to a temperature of 60° C. Next, distilled water (11.98 g) was instilled in, and after the instillation had been completed, the solution was stirred at 120° C. for 6 hours. Ultimately, a 1-methoxy-2-propanol solution of a component (A) having the solid content adjusted to 65 wt % was obtained. This shall be referred to as 'siloxane oligomer solution 1'.

Synthesis Example 2

Phenyltrimethoxysilane (30.56 g), 3,3,4,4,5,5,6,6,7,7,8,8, 9,9,10,10,10-heptadecafluorodecyl-triethoxy-silane (18.15 g), tetraethoxysilane (9.88 g), methyl-n-amyl ketone (27.72 g), and oxalic acid (0.04 g) were added into a flask equipped with a stirrer and a reflux tube, and after stirring, the solution was heated to a temperature of 60° C. Next, distilled water (13.66 g) was instilled in, and after the instillation had been completed, the solution was stirred at 120° C. for 6 hours. Ultimately, a methyl-n-amyl ketone solution, which is component (A), having the solid content adjusted to 70 wt % was obtained. This shall be referred to as 'siloxane oligomer solution 2'.

Synthesis Example 3

Methyltrimethoxysilane (2.97 g), phenyltrimethoxysilane (29.01 g), 3,3,4,4,5,5,6,6,7,7,8,8,9,9,10,10,10-heptadecafluorodecyl-triethoxy-silane (25.64 g), 1-methoxy-2-propanol (31.00 g), and oxalic acid (0.04 g) were added into a flask equipped with a stirrer and a reflux tube, and after stirring, the solution was heated to a temperature of 60° C. Next, distilled water (11.35 g) was instilled in, and after the instillation had been completed, the solution was stirred at 120° C. for 6 hours. Ultimately, a 1-methoxy-2-propanol solution of component (A) having the solid content adjusted to 70 wt % was obtained. This shall be referred to as 'siloxane oligomer solution 3'.

Comparative Synthesis Example 1

Phenyltrimethoxysilane (30.79 g), 3,3,4,4,5,5,6,6,7,7,8,8, 9,9,10,10,10-heptadecafluorodecyltriethoxysilane (22.64 g), tetraethoxysilane (4.62 g), 1-methoxy-2-propanol (29.93 g), and oxalic acid (0.04 g) were added into a flask equipped with a stirrer and a reflux tube, and after stirring, the solution was heated to a temperature of 60° C. Next, distilled water (11.98 g) was instilled in, and after the instillation had been completed, the solution was stirred at 120 C. for 6 hours. After that, the 1-methoxy-2-propanol was removed, and the viscous liquid thus obtained was further subjected to vacuum drying. This shall be referred to as 'siloxane oligomer 4'.

Comparative Synthesis Example 2

Pentafluorophenylethyltrichlorosilane (236.9 g) and (3,3, 3-trifluoropropyl)trichlorosilane (231.5 g) were dissolved in 1 liter of tetrahydrofuran that had been subjected to dehydration treatment, and water (92.9 g) was instilled in slowly such that the liquid temperature did not rise. Next, while stirring the reaction liquid, sodium hydrogencarbonate (433.4 g) was added therein. After the generation of carbon dioxide had finished, stirring was continued for a further 1 hour. Next, the reaction liquid was filtered, and the tetrahydrofuran was distilled off from the filtrate using a rotary evaporator, whereupon a transparent colorless viscous liquid was obtained. This liquid was further subjected to vacuum drying, thus obtaining 'siloxane oligomer 5'.

Comparative Synthesis Example 3

Methyltrimethoxysilane (32.27 g), phenyltrimethoxysilane (24.41 g), 1-methoxy-2-propanol (23.85 g), and oxalic acid (0.03 g) were added into a flask equipped with a stirrer and a reflux tube, and after stirring, the solution was heated to a temperature of 60° C. Next, distilled water (19.44 g) was instilled in, and after the instillation had been completed, the solution was stirred at 120° C. for 6 hours. Ultimately, a 1-methoxy-2-propanol solution having a solid content adjusted to 70 wt % was obtained. This shall be referred to as 'siloxane oligomer solution 6'.

Comparative Synthesis Example 4

A copolymer of methyl methacrylate and 3-methacryloxypropyltrimethoxysilane (solid concentration: 27 wt %, diluted with methoxypropanol) (28.16 g), methyltrimethoxysilane (36.42 g), phenyltrimethoxysilane (20.37 g), and oxalic acid (0.04 g) were added into a flask equipped with a stirrer and a reflux tube, and after stirring, the solution was heated to a temperature of 60° C. Next, distilled water (15.01 g) was instilled in, and after the instillation had been completed, the solution was stirred at 60° C. for 6 hours. Ultimately, a 1-methoxy-2-propanol solution having a solid content adjusted to 70 wt % was obtained. This shall be referred to as 'siloxane oligomer solution 7'.

[Preparation of Radiation-Curable Compositions]

0.32 g of 1-(4,7-di-t-butoxy)-naphthyltetrahydrothiophenium trifluoromethanesulfonate as a photoacid generator, 0.03 g of tri-n-octylamine, and 7.09 g of 1-methoxy-2-propanol were added to 92.56 g (solid component plus organic solvent) of siloxane oligomer solution 1, and mixing to homogeneity was carried out, thus obtaining a 'Composition 1' having the solid concentration adjusted to 65 wt %.

'Composition 2' to 'Composition 8' as shown in Table 1 were then prepared in a similar way to 'Composition 1'.

Example 1

Composition 3 was applied onto the surface of a silicon substrate using a spin coater, drying was carried out for 10 minutes at 120° C., and then irradiation with ultraviolet radiation of wavelength 365 nm and intensity 6 mW/cm$^2$ was carried out for 3 minutes using an exposing apparatus (a photo-aligner made by Canon). Heating was then further carried out for 1 hour at 200° C., thus forming a lower clad layer of thickness 9 μm. The refractive index of this lower clad layer to light of wavelength 1550 nm was 1.439.

Next, composition 1 was applied onto the lower clad layer using a spin coater, drying was carried out for 5 minutes at 100° C., and then using a photomask having an optical waveguide pattern of width 9 μm formed therein, exposure was carried out by irradiating with ultraviolet radiation of wavelength 365 nm and intensity 6 mW/cm$^2$ for 1 minute using an exposing apparatus. After that, the substrate was heated for 1 minute at 100° C., and was then immersed in a developing solution comprising a 5% tetramethylammonium hydroxide (TMAH) aqueous solution to dissolve the unexposed parts, and was then washed with water. After that, irradiation with ultraviolet radiation was carried out for 3 minutes, and then heating was carried out for 1 hour at 200° C., thus forming a core portion of thickness 9 μm. The refractive index of the obtained core portion to light of wavelength 1550 nm was 1.445.

Radiation-curable composition 3 was further applied using a spin coater onto the upper surface of the lower clad layer having the core portion thereon, drying was carried out for 10 minutes at 120° C., and then irradiation with ultraviolet radiation of wavelength 365 nm and intensity 6 mW/cm$^2$ was carried out for 10 minutes. Heating was then further carried out for 1 hour at 250° C., thus forming an upper clad layer of thickness 9 μm, whereby an optical waveguide was formed. The refractive index of the formed upper clad layer to light of wavelength 1550 nm was 1.439.

For Example 2 and Comparative Examples 1, 2 and 3, an optical waveguide was again manufactured in a similar way

TABLE 1

| | (Units: g) | Composition 1 | Composition 2 | Composition 3 | Composition 4 | Composition 5 | Composition 6 | Composition 7 |
|---|---|---|---|---|---|---|---|---|
| A | Siloxane oligomer solution 1 | 92.6 | | | | | | |
| | Siloxane oligomer solution 2 | | 92.6 | | | | | |
| | Siloxane oligomer solution 3 | | | 92.8 | | | | |
| A' | Siloxane oligomer 4 | | | | 64.8 | | | |
| | Siloxane oligomer 5 | | | | | 64.8 | | |
| | Siloxane oligomer solution 6 | | | | | | 85.2 | |
| | Siloxane oligomer solution 7 | | | | | | | 92.8 |
| B | 1-(4,7-di-t-butoxy)-naphthyltetrahydrothiophenium trifluoromethanesulfonate | 0.32 | 0.32 | | 0.32 | 0.32 | 0.32 | 0.06 |
| | SP172 (made by Asahi Denka) | | | 0.06 | | | | |
| C | 1-methoxy-2-propanol[1] | 39.5 | | 35.0 | 34.9 | 34.9 | 40.0 | 35.0 |
| | Methyl-n-amyl ketone[2] | | 34.9 | | | | | |
| D | Trioctylamine | 0.03 | 0.03 | | 0.03 | | 0.03 | |
| | Amount of component (A) | 60.2 | 64.8 | 65.0 | | | | |
| | Amount of siloxane oligomer other than (A) | | | | 64.8 | 64.8 | 59.6 | 65.0 |
| | Content of silanol groups out of all bonding groups on Si (%) | 29 | 28 | 30 | 5 | 4 | 23 | 25 |

[1] Amount of 1-methoxy-2-propanol includes amount contained in siloxane oligomer solution.
[2] Amount of methyl-n-amyl ketone is amount contained in siloxane oligomer solution.

to Example 1, and evaluation was carried out. The evaluation results are shown in Table 2.

TABLE 2

|  |  | Example 1 | Example 2 | Comparative Example 1 | Comparative Example 2 | Comparative Example 3 |
|---|---|---|---|---|---|---|
| Materials | Under-cladding | Composition 3 | Composition 3 | Composition 7 | Composition 7 | Composition 7 |
|  | Core | Composition 1 | Composition 2 | Composition 4 | Composition 5 | Composition 6 |
|  | Over-cladding | Composition 3 | Composition 3 | Composition 7 | Composition 7 | Composition 7 |
| Properties | Patterning ability | ◯ | ◯ | X (*) | X (*) | ◯ |
|  | Waveguide loss 1310 nm | 0.3 | 0.3 | — | — | 0.4 |
|  | [dB/cm] 1550 nm | 0.4 | 0.4 | — | — | 1.0 |
|  | Interfacial peeling | ◯ | ◯ | — | — | ◯ |
|  | Cracking resistance | ◯ | ◯ | — | — | X |
|  | Long-term reliability | ◯ | ◯ | — | — | X |

(*) Patterning was not possible.

[Measurement of Silanol Content]

Each composition was diluted with deuterated chloroform, which is a solvent for NMR measurement, and the silanol content was measured by Si-NMR. Specifically, for the plurality of silane components having different substituents or bonding groups appearing from −120 ppm to −60 ppm, the peaks were separated by curve fitting, and the molar percentages of the components were calculated from the area ratios of the peaks. Then, multiplying by the number of silanol groups in each component obtained, the proportion (%) of silanol groups out of all the bonding groups on Si was calculated.

An example calculation is as follows:

|  | Mol % | Number of silanol groups |
|---|---|---|
| Peak 1: R—Si(OH)$_3$ | a | 3 |
| Peak 2: R—Si(OH)$_2$(OSi) | b | 2 |
| Peak 3: R—Si(OH)(OSi)$_2$ | c | 1 |
| Peak 4: R—Si(OSi)$_3$ | d | 0 |

Silanol content (%) out of all bonding groups on
Si=(3a+2b+c)×100/[4×(a+b+c+d)]

[Patterning Ability]

Each manufactured waveguide was cleaved to reveal an end face, and the core shape (width, height) was measured using an optical microscope. The case of being within ±0.5 m from the design values (width 9 μm, height 9 μm) was taken as '◯', and the case that this was not so, or the shape was rectangular or trapezoidal, or the core could not be patterned was taken as 'X'.

[Waveguide Loss]

Light of wavelength 1310 nm or 1550 nm was inputted from one end of the waveguide, and the quantity of light emerging from the other end was measured using a power meter (MT9810A actinometer made by Anritsu) to determine the loss [dB]. The waveguide loss [dB/cm] was obtained by cleaving the waveguide, measuring the loss at each length, plotting the loss against the length, and calculating the waveguide loss [dB/cm] from the gradient of the graph (cut-back method).

[Interfacial Peeling]

An end face obtained by cleaving the manufactured waveguide was observed using a scanning electron microscope (SEM), thus measuring whether or not there was peeling away between the substrate and the lower clad layer, the lower clad layer and the core portion, the core portion and the upper clad layer, or the lower clad layer and the upper clad layer. Furthermore, it was observed whether or not there was peeling away on the core line using an optical microscope from above the waveguide. The case that peeling was not observed in either case was taken as '◯', and the case that peeling was observed in either case was taken as 'X'.

[Cracking Resistance]

The obtained waveguide was heated for 1 hour at 300° C., and was allowed to cool naturally, and then it was observed over the whole of the waveguide using an optical microscope whether or not cracking had occurred; the case that cracking was not observed was taken as '◯', and the case that cracking was observed in either the core portion or the clad layers was taken as 'X'.

[Long-Term Reliability]

The obtained waveguide was left for 2000 hours under conditions of a temperature of 85° C. and a relative humidity of 85%, and was then left for 24 hours at a temperature of 25° C. and a relative humidity of 50%. The transmission loss was measured, and the waveguide loss was calculated. The case that the waveguide loss was not more than 0.5 dB/cm at both a wavelength of 1310 nm and a wavelength of 1550 nm was taken as '◯', and the case that was not so was taken as 'X'.

The invention claimed is:

1. A radiation-curable composition comprising components (A) and (B):
   (A) at least one member selected from the group consisting of hydrolyzates of hydrolyzable silane compounds represented by general formula (1) and condensates of said hydrolyzates

   $(R^1)_p(R^2)_q Si(X)_{4-p-q}$      (1)

wherein, in general formula (1), $R^1$ is a non-hydrolyzable organic group having 1 to 12 carbon atoms that contains fluorine atoms, $R^2$ is a non-hydrolyzable organic group having 1 to 12 carbon atoms (but excluding ones that contain fluorine atoms), X is a hydrolyzable group, p is an integer of 1 or 2, and q is an integer of 0 or 1; and (B) a photoacid generator;
wherein a content of silanol (Si—OH) groups out of all the bonding groups on Si in the composition is 10 to 50%.

2. The radiation-curable composition according to claim 1, wherein said component (A) has at least one structure selected from the group consisting of structures represented by general formulae (2) and (3)

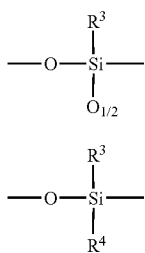

wherein, in general formulae (2) and (3), $R^3$ is a non-hydrolyzable organic group having 1 to 12 carbon atoms that contains fluorine atoms, and $R^4$ is a non-hydrolyzable organic group having 1 to 12 carbon atoms that optionally contains fluorine atoms, and may be the same as $R^3$.

3. The radiation-curable composition according to claim 2, wherein $R^1$ in general formula (1) is $CF_3(CF_2)_n(CH_2)_m$ and wherein m is an integer from 0 to 5, n is an integer from 1 to 11, and m+n is from 1 to 11.

4. The radiation-curable composition according to claim 3, wherein said component (A) further has at least one structure selected from the group consisting of structures represented by general formulae (4) and (5)

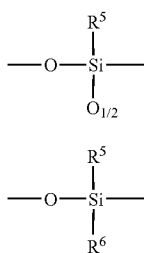

wherein, in general formulae (4) and (5), $R^5$ is a phenyl group or a fluorinated phenyl group, and $R^6$ is a non-hydrolyzable organic group having 1 to 12 carbon atoms that optionally contains fluorine atoms, and may be the same as $R^5$.

5. The radiation-curable composition according to claim 1, wherein the amount of said photoacid generator (B), per 100 parts by weight of said component (A), is 0.01 to 15 parts by weight.

6. A method of forming an optical waveguide comprising a lower clad layer, a core portion formed on a part of the region of said lower clad layer, and an upper clad layer formed on said lower clad layer, such as to cover said core portion, the method comprising, applying, on at least one member selected from said lower clad layer, said core portion or said upper clad layer, a radiation-curable composition according to claim 1, as a material, and irradiating with irradiation, thus forming the optical waveguide.

7. An optical waveguide comprising a lower clad layer, a core portion formed on a part of the region of said lower clad layer, and an upper clad layer formed on said lower clad layer, such as to cover said core portion, and wherein at least one member, selected from said lower clad layer, said core portion or said upper clad layer, comprises a radiation-curable composition according to claim 1.

8. The radiation-curable composition according to claim 2, wherein the amount of said photoacid generator (B), per 100 parts by weight of said component (A), is 0.01 to 15 parts by weight.

9. The radiation-curable composition according to claim 3, wherein the amount of said photoacid generator (B), per 100 parts by weight of said component (A), is 0.01 to 15 parts by weight.

10. The radiation-curable composition according to claim 4, wherein the amount of said photoacid generator (B), per 100 parts by weight of said component (A), is 0.01 to 15 parts by weight.

11. A method of forming an optical waveguide comprising a lower clad layer, a core portion formed on a part of the region of said lower clad layer, and an upper clad layer formed on said lower clad layer, such as to cover said core portion, the method comprising, applying, on at least one member selected from said lower clad layer, said core portion or said upper clad layer, a radiation-curable composition according to claim 2, as a material, and irradiating with irradiation, thus forming the optical waveguide.

12. A method of forming an optical waveguide comprising a lower clad layer, a core portion formed on a part of the region of said lower clad layer, and an upper clad layer formed on said lower clad layer, such as to cover said core portion, the method comprising, applying, on at least one member selected from said lower clad layer, said core portion or said upper clad layer, a radiation-curable composition according to claim 3, as a material, and irradiating with irradiation, thus forming the optical waveguide.

13. A method of forming an optical waveguide comprising a lower clad layer, a core portion formed on a part of the region of said lower clad layer, and an upper clad layer formed on said lower clad layer, such as to cover said core portion, the method comprising, applying, on at least one member selected from said lower clad layer, said core portion or said upper clad layer, a radiation-curable composition according to claim 4, as a material, and irradiating with irradiation, thus forming the optical waveguide.

14. A method of forming an optical waveguide comprising a lower clad layer, a core portion formed on a part of the region of said lower clad layer, and an upper clad layer formed on said lower clad layer, such as to cover said core portion, the method comprising, applying, on at least one member selected from said lower clad layer, said core portion or said upper clad layer, a radiation-curable composition according to claim 5, as a material, and irradiating with irradiation, thus forming the optical waveguide.

15. An optical waveguide comprising a lower clad layer, a core portion formed on a part of the region of said lower clad layer, and an upper clad layer formed on said lower clad layer, such as to cover said core portion, and wherein at least one member, selected from said lower clad layer, said core portion or said upper clad layer, comprises a radiation-curable composition according to claim 2.

16. An optical waveguide comprising a lower clad layer, a core portion formed on a part of the region of said lower clad layer, and an upper clad layer formed on said lower clad layer, such as to cover said core portion, and wherein at least one member, selected from said lower clad layer, said core portion or said upper clad layer, comprises a radiation-curable composition according to claim 3.

17. An optical waveguide comprising a lower clad layer, a core portion formed on a part of the region of said lower clad layer, and an upper clad layer formed on said lower clad layer, such as to cover said core portion, and wherein at least one member, selected from said lower clad layer, said core portion or said upper clad layer, comprises a radiation-curable composition according to claim 4.

18. An optical waveguide comprising a lower clad layer, a core portion formed on a part of the region of said lower clad layer, and an upper clad layer formed on said lower clad layer, such as to cover said core portion, and wherein at least one member, selected from said lower clad layer, said core portion or said upper clad layer, comprises a radiation-curable composition according to claim 5.

* * * * *

UNITED STATES PATENT AND TRADEMARK OFFICE
CERTIFICATE OF CORRECTION

| | | |
|---|---|---|
| PATENT NO. | : 7,162,131 B2 | Page 1 of 1 |
| APPLICATION NO. | : 10/513355 | |
| DATED | : January 9, 2007 | |
| INVENTOR(S) | : Takase et al. | |

It is certified that error appears in the above-identified patent and that said Letters Patent is hereby corrected as shown below:

On the title page, Item (86), the Filing Date is incorrect. Item (86) should read:

-- (86) PCT No.:   PCT/JP03/13371

§ 371 (c)(1),
(2), (4) Date:  Jul. 6, 2005 --

Signed and Sealed this

Twentieth Day of March, 2007

JON W. DUDAS
*Director of the United States Patent and Trademark Office*